United States Patent
Yamamoto et al.

(10) Patent No.: US 7,838,888 B2
(45) Date of Patent: Nov. 23, 2010

(54) SILCON CARBIDE SEMICONDUCTOR DEVICE HAVING SCHOTTKY BARRIER DIODE AND METHOD FOR MANUFACTURING THE SAME

(75) Inventors: Takeo Yamamoto, Nishikamo-gun (JP); Naohiro Suzuki, Anjo (JP); Eiichi Okuno, Mizuho (JP)

(73) Assignee: DENSO CORPORATION, Kariya (JP)

( * ) Notice: Subject to any disclaimer, the term of this patent is extended or adjusted under 35 U.S.C. 154(b) by 150 days.

(21) Appl. No.: 12/076,874

(22) Filed: Mar. 25, 2008

(65) Prior Publication Data
US 2008/0258153 A1 Oct. 23, 2008

(30) Foreign Application Priority Data
Apr. 18, 2007 (JP) ............................. 2007-109224

(51) Int. Cl.
H01L 29/24 (2006.01)
H01L 21/329 (2006.01)
(52) U.S. Cl. .......... 257/77; 257/E29.104; 257/E21.359; 257/E29.338; 257/211; 257/339; 438/572
(58) Field of Classification Search .................. 257/77, 257/211, 339, 492, 493, 331, 354, E21.359, 257/E21.368, E29.104, E29.338; 438/572
See application file for complete search history.

(56) References Cited

U.S. PATENT DOCUMENTS
2008/0169475 A1* 7/2008 Nishio et al. ................... 257/77

FOREIGN PATENT DOCUMENTS
JP   A-2000-294804   10/2000
JP   A-2003-158259   5/2003

OTHER PUBLICATIONS
English Translation of JP 2003-158259.*
Office Action dated Apr. 22, 2009 issued by Japan Patent Office in corresponding JP Application No. 2007-109224 (and English Translation).
* cited by examiner

*Primary Examiner*—Victor A Mandala
*Assistant Examiner*—Whitney Moore
(74) *Attorney, Agent, or Firm*—Posz Law Group, PLC (57) ABSTRACT

An SiC semiconductor device is provided, which comprises: a substrate made of silicon carbide and having a principal surface; a drift layer made of silicon carbide and disposed on the principal surface; an insulating layer disposed on the drift layer and including an opening; a Schottky electrode contacting with the drift layer through the opening; a termination structure disposed around an outer periphery of the opening; and second conductivity type layers disposed in a surface part of the drift layer, contacting the Schottky electrode, surrounded by the termination structure, and separated from one another. The second conductivity type layers include a center member and ring members. Each ring member surrounds the center member and is arranged substantially in a point symmetric manner with respect to the center member.

7 Claims, 5 Drawing Sheets

SILCON CARBIDE SEMICONDUCTOR DEVICE HAVING SCHOTTKY BARRIER DIODE AND METHOD FOR MANUFACTURING THE SAME

CROSS REFERENCE TO RELATED APPLICATION

The present application is based on Japanese Patent Application No. 2007-109224 filed on Apr. 18, 2007, the disclosure of which is incorporated herein by reference.

FIELD OF THE INVENTION

The present invention relates to a silicon carbide semiconductor device having a Schottky barrier diode and a method for manufacturing the same.

BACKGROUND OF THE INVENTION

In a Schottky barrier diode (SBD), at an interface between a Schottky electrode made of metal and a semiconductor region, work function difference between the metal and semiconductor is typically small. Because of the material property difference, a leakage current of the SBD may be relatively larger than that of a P-N diode when the diodes are reverse-biased.

To suppress the leakage current of an SBD, Japanese Patent Application Publication No. 2000-294804 shows a configuration, in which a P-N diode is disposed on a part of Schottky junction. More specifically, multiple P type layers having a stripe and projected structure are disposed around a contact region between a Schottky electrode and a surface part or an inside of a drift layer.

In the configuration shown in Japanese Patent Application Publication No. 2000-294804, however, since the P type layers have the stripe structure, it is considerably difficult to design an overlap part where the P type layers overlaps with a termination structure. The terminal structure includes a resurf layer and a guard ring layer, and surrounds a cell in which SBD formed. It has been therefore difficult to provide an SiC semiconductor device having an SBD, the SiC semiconductor device being capable of reducing the leakage current when the SBD is reverse-biased and having a high breakdown voltage and high yield ratio.

SUMMARY OF THE INVENTION

In view of the above-described problem, it is an object of the present invention to provide a silicon carbide (SiC) semiconductor device having an SBD, the SiC semiconductor device being capable of reducing a leakage current when the SBD is reverse-biased and having high breakdown voltage and high yield ratio. It is also an object of the present invention to provide a method for manufacturing an silicon carbide semiconductor device having an SBD, the SiC semiconductor device being capable of reducing a leakage current when the SBD is reverse-biased and having high breakdown voltage and high yield ratio.

According to a first aspect of the present invention, an SiC semiconductor device comprises: a substrate made of silicon carbide, having a first conductivity type, and having a principal surface and a rear surface opposite to each other; a drift layer made of silicon carbide, having a first conductivity type, and disposed on the principal surface of the substrate, wherein an impurity concentration of the drift layer is lower than that of the substrate; an insulating layer disposed on the drift layer and including an opening, wherein a part of the substrate and a part of the drift layer are defined as a cell, which is positioned between the opening of the insulating layer and the rear surface of the substrate; an ohmic electrode disposed on the rear surface of the substrate; a Schottky electrode contacting with the drift layer through the opening of the insulating layer; a Schottky barrier diode provided by the ohmic electrode, the Schottky electrode and the cell; a termination structure that is disposed on an outer periphery of the cell, and that includes a resurf layer disposed in a surface part of the drift layer, wherein the resurf layer surrounds the cell; and a plurality of second conductivity type layers disposed in another surface part of the drift layer, contacting the Schottky electrode, surrounded by the resurf layer, and separated from one another. The plurality of second conductivity type layers includes a center member, which is disposed at a center of a contact region between the Schottky electrode and the drift layer. The plurality of second conductivity type layers further includes a plurality of ring members, each of which surrounds the center member. Each ring members is arranged substantially in a point symmetric manner on the contact region with respect to a center of the center member.

According to the above SiC semiconductor device, the SiC semiconductor device having a high symmetric structure is provided. The SiC semiconductor device is capable of reducing a leakage current when the SBD is reverse-biased. It is possible to provide the SiC semiconductor device having a high breakdown voltage with high yield ratio.

According to a second aspect of the present invention, an SiC semiconductor device comprises: a substrate made of silicon carbide, having a first conductivity type, and having a principal surface and a rear surface opposite to each other; a drift layer made of silicon carbide, having a first conductivity type, and disposed on the principal surface of the substrate, wherein an impurity concentration of the drift layer is lower than that of the substrate; an insulating layer disposed on the drift layer, and including an opening, wherein a part of the substrate and a part of the drift layer disposed between the opening and the rear surface of the substrate are defined as a cell; an ohmic electrode disposed on the rear surface of the substrate; a Schottky electrode contacting with the drift layer through the opening of the insulating layer; a Schottky barrier diode provided by the cell, the ohmic electrode and the Schottky electrode; a termination structure that is disposed on an outer periphery of the cell, and that includes a resurf layer disposed in a surface part of the drift layer, wherein the resurf layer surrounds the cell; and a plurality of second conductivity type layers disposed in another surface part of the drift layer, contacting the Schottky electrode, surrounded by the resurf layer, and separated from one another. Each second conductivity type layer substantially has a hexagonal shape. The plurality of second conductivity type layers is arranged so as to have a honeycomb structure on a contact region between the Schottky electrode and the drift layer. The plurality of second conductivity type layers is arranged so as to have a point symmetry on the contact region with respect to a center of the contact region. A two-dimensional plane passing through the center of the contact region and perpendicular to the principal surface of the substrate is defined as a first plan. A plurality of cross sections corresponding to the plurality of second conductivity type layers taken along the first plane is defined as a plurality of first cross sections. The plurality of second conductivity type layers is configured so that an arrangement of the plurality of first cross sections on the first plane is substantially symmetric.

According to the above SiC semiconductor device, the SiC semiconductor device having a high symmetric structure is provided. The SiC semiconductor device is capable of reducing a leakage current when the SBD is reverse-biased. It is possible to provide the SiC semiconductor device having a high breakdown voltage with high yield ratio.

According to a third aspect of the present invention, a method for manufacturing an SiC semiconductor device comprises: forming a drift layer on a principal surface of a substrate by epitaxial growth, wherein the drift layer and the substrate are made of silicon carbide and have a first conductivity type; forming a first mask on the drift layer, wherein the first mask has a first ring-shaped opening; forming a resurf layer having a second conductivity type by implantation of impurities into the drift layer through the ring-shape opening of the first mask; removing the first mask; forming a second mask on the drift layer and the resurf layer, the second mask having a plurality of second openings; forming a plurality of second conductivity type layers in a surface of the drift layer by implantation of impurities into the drift layer through the plurality of second openings of the second mask, wherein the plurality of second conductivity type layers includes a center member and a plurality of ring members, and each ring member surrounds the center member and is arranged substantially in a point symmetric manner with respect to a center of a region on which the plurality of second conductivity type layers is formed; removing the second mask; forming an insulating layer on the drift layer, the resurf layer, and the plurality of second conductivity type layers; forming a third opening on the insulating layer through photolithography-etching; forming a Schottky electrode contacting with the drift layer through the third opening of the insulating layer; and forming an ohmic electrode on a rear surface of the substrate, the rear surface being opposite to the principal surface of the substrate.

According to the above method for manufacturing an SiC semiconductor device, an SiC semiconductor device having a high symmetric structure is provided. The SiC semiconductor device is capable of reducing a leakage current when the SBD is reverse-biased. It is possible to provide the SiC semiconductor device having a high breakdown voltage with high yield ratio.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

An SiC semiconductor device according to a first embodiment is described below with reference to FIGS. 1 and 2.

The SiC semiconductor device includes an N+ type substrate 1 made of SiC. An impurity concentration of the N+ type substrate 1 ranges, for example, between $2 \times 10^{18}$ cm$^{-3}$ and $1 \times 10^{21}$ cm$^{-3}$. The N+ type substrate 1 includes a top surface 1a and a bottom surface 1b opposite to each other, which are also called hereinafter a principal surface 1a and a rear surface 1b, respectively. An N− type drift layer 2 made of SiC is disposed on the principal surface 1a. The N− type drift layer 2 may be a stacked layer. A dopant concentration of the N− type drift layer 2 is, for example, in a range between $2.5 \times 10^{15}$ cm$^{-3}$ and about $7.5 \times 10^{15}$ cm$^{-3}$ and lower than that of the N+ type substrate 1. Parts of the N+ type substrate 1 and the N− type drift layer 2 provide a cell where a SBD 10 is disposed. The SiC semiconductor device includes a termination structure disposed in an area surrounding the cell.

An insulating layer 3 is disposed on a surface of the N− type drift layer 2 and includes a opening 3a. A location of the opening corresponds to the cell. The insulating layer 3 may be a silicon oxide layer. As shown in FIG. 1, a part of a Schottky electrode 4 is disposed in the opening 3a and in contact with the N− type drift layer 2. The Schottky electrode 4 is made of, for example, molybdenum (Mo), titanium (Ti) or nickel (Ni). The opening 3a has an almost circular shape as shown in FIG. 2. Contact between the Schottky electrode 4 and the N− type drift layer 2 in the opening 3a provides a Schottky barrier junction. An ohmic electrode 5 made of Ni, Ti, Mo, tungsten (W) or the like is disposed on and in contact with the rear surface 1b of the N+ type substrate 1. The above configuration provides the SBD 10.

The termination structure disposed in an area surrounding the SBD 10 includes a P type resurf layer 6 and multiple P type guard ring layers 7. The P type resurf layer 6 is disposed in a surface part of the N− type drift layer 2 so as to contact with the Schottky electrode 4. The multiple P type guard ring layers 7 are disposed in an area surrounding the P type resurf layer 6. The P type resurf layer 6 includes impurity such as aluminum and an impurity concentration ranges between $5 \times 10^{16}$ cm$^{-3}$ and $1 \times 10^{18}$ cm$^{-3}$. The P type resurf layer 6 and the P type guard ring layers 7 have an almost circular ring shape. The presence of the layers 6, 7 allow electric field to extend to a wide area surrounding the SBD 10, and thereby, electric field concentration is relaxed. Therefore, improved breakdown voltage is provided.

Multiple P type layers 8 are disposed in an area surround by an inner circumference of the P type resurf layer 6, which may be closest to the cell among the termination structure. The P type layers 8 are in contact with the Schottky electrode 4. As shown in FIG. 2, the P type layers 8 have a circular ring shape. An outer circumference of the P type layers 8 is disposed along an outer circumference of the cell. Alternatively, an outer circumference of the Schottky electrode 4 is disposed along an outer circumference of the cell. The P type layers 8 includes a center member 8a having a circular shape and multiple circular ring members 8b-8e. The circular ring members 8b-8d are arranged in a concentric pattern with respect to the center member 8a. The center member 8a is disposed at a central area of the contact region between the Schottky electrode 4 and the N– type drift layer 2. In the present embodiment, the number of the circular ring members 8b-8e is four. The ring member 8e, which is disposed outermost distant from the center member 8a, is defined as the outermost ring member 8e. The outermost ring member 8e is in contact with an inner circumference surface of the P type resurf layer 6 or is embedded in the P type resurf layer 6. An arrangement of cross sections of the circular ring members 8b-8e is symmetric on a cross section of the SiC semiconductor device taken along a plane passing the center of the center member 8a in a radial direction of the center member 8a. The p type layers 8a-8e are arranged at regular intervals W1. Each ring member 8b-8e has an approximately same width W2 along a radial direction of the center member 8a. The above P type layers 8 have an impurity concentration ranging, for example, between $5 \times 10^{17}$ cm$^{-3}$ and $1 \times 10^{20}$ cm$^{-3}$. The regular interval W1 between adjacent P type layers 8 is in a range, for example, between 1.5 μm and 2.5 μm. The width W2 is in a range between 1.0 μm and 2.0 μm. A depth of each p type layer 8 is in a range between 0.3 μm and 1.0 μm.

In the SiC semiconductor device including the SBD 10 having the above-described structure, a current flows between the Schottky electrode 4 and the ohmic electrode 5 when a voltage larger than a Schottky barrier is applied to the Schottky electrode 4 in such a manner that the Schottky electrode 4 and the ohmic electrode 5 provide an anode and a cathode of the SBD 10, respectively.

The P type layers 8 are disposed below the Schottky electrode 4. When the SBD 10 is OFF, a depletion layer extends from the multiple P type layers 8 to the N– type drift layer; thereby, parts of the N– type drift layer 2 positioned between the P type layers 8 are almost fully depleted. It is possible to reduce a leakage current when the SBD 10 is reverse-biased.

In the present embodiment, the above-described structure is provided in such a manner that the ring members 8b-8e of the P type layers 8 are concentrically arranged with respect to the center member 8a, which is disposed on the central region of the contact region between the Schottky electrode 4 and the N– type drift layer 2. Specifically, an arrangement of the multiple P type layers 8 is symmetric with respect to the center member 8a. Also, on a cross-sectional the SiC semiconductor device taken along a plane passing a center of the center member 8a and perpendicular to the principal surface, an arrangement of cross sections of the ring members 8b-8d is symmetric between the center member 8a and the outermost ring member 8e. It is thus possible to provide a high symmetric structure. Further, it is possible to provide a simple design of an overlap part, at which the P type layers 8 may overlap with the termination structure including the P type resurf layer 6 and the P type guard ring layers 7. It is possible to provide the SiC semiconductor device including the SBD, the SiC semiconductor device having a high yield ratio and a high breakdown voltage.

A method for manufacturing the SiC semiconductor device according to the present embodiment is described below with reference to FIGS. 3A to 3E. Note that the P type guard ring layers 7 are not shown in FIGS. 3A to 3E.

Figure 3A:
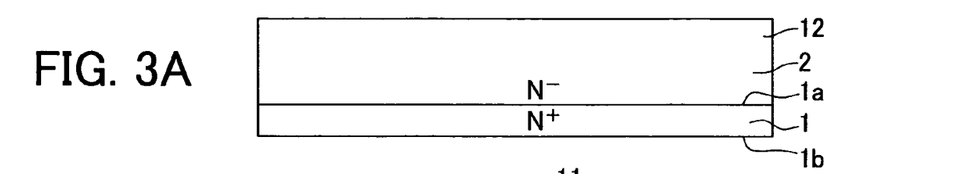
FIGS. 3A-3E are cross sectional views of the SiC semiconductor device, showing manufacture processes of the SiC semiconductor device shown in FIG. 1.

At a process shown in FIG. 3A, the N– type drift layer 2 is epitaxially grown on the principal surface 1a.

Figure 3B:
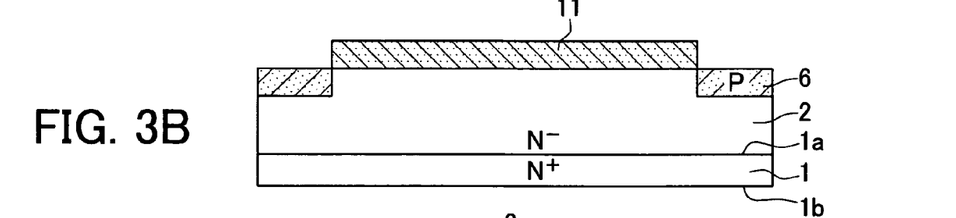

At a process shown in FIG. 3B, after positioning a mask 11 including an LTO (low-temperature oxide) or the like, openings are formed on the mask 11 by photolithography-etching. Positions of the openings correspond to areas where the P type resurf layer 6 and the P type guard ring layers 7 are to be formed. Then, with using the mask 11, the P type resurf layer 6 and the P type guard ring layers 7 are formed by implantation of P type impurities such as Al and by heat treatment for impurity activation.

Figure 3C:
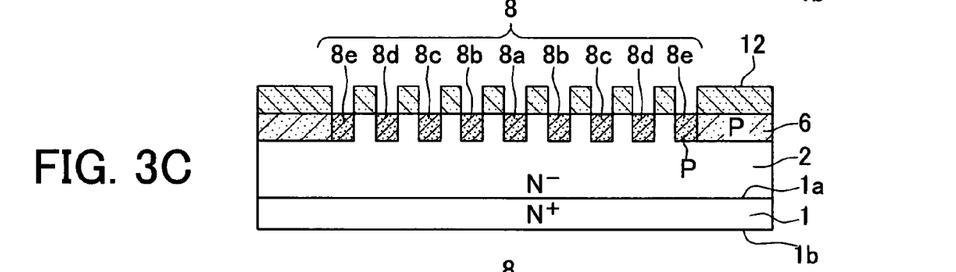

At a process shown in FIG. 3C, after removing the mask 11, a mask 12 including an LTO is positioned, and then, openings are formed on the mask 12 by photolithography-etching. Positions of the openings correspond to areas where the P type layers 8 are to be formed. And, with using the mask 12, the P type layers 8 are formed by implantation of P type impurities such as Al and by heat treatment for impurity activation.

Figure 3D:
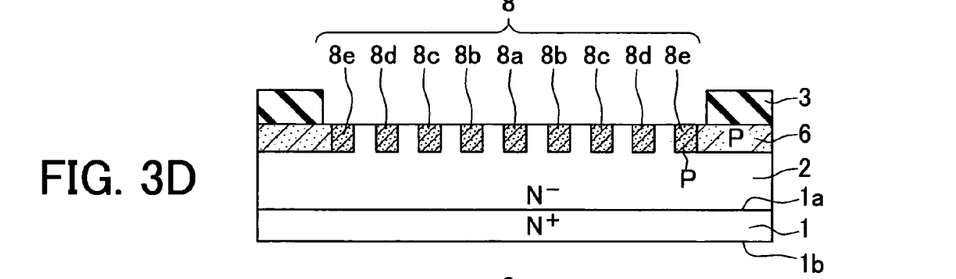

At a process shown in FIG. 3D, after removing the mask 12, a silicon oxide layer is formed by, for example, plasma CVD (chemical vapor deposition), and then, the insulating layer 3 is formed by reflow-processing the silicon oxide layer. The opening 3a is formed on the insulating layer 3 through photolithography-etching.

Figure 3E:
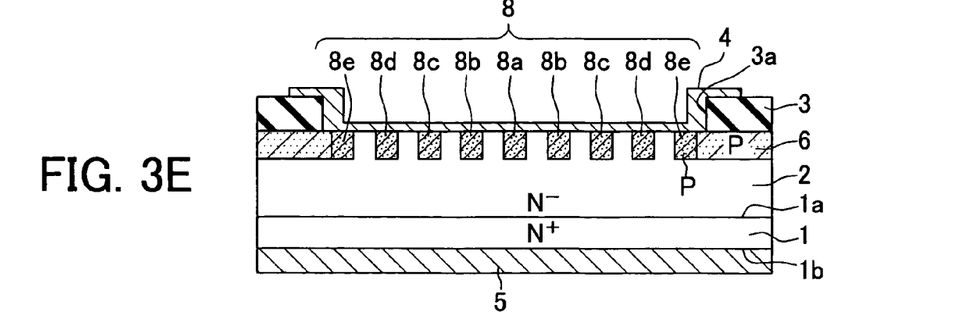

At a process shown in FIG. 3E, a metal layer made of Mo, Ti or Ni is formed on the insulating layer 3 and an inner wall of the opening 3a. The Schottky electrode 4 is formed by patterning the metal. A metal layer made of Ni, Ti, Mo, W, or the like is formed on the rear surface 1b of the N+ type substrate 1 to provide the ohmic electrode 5.

Figure 1:
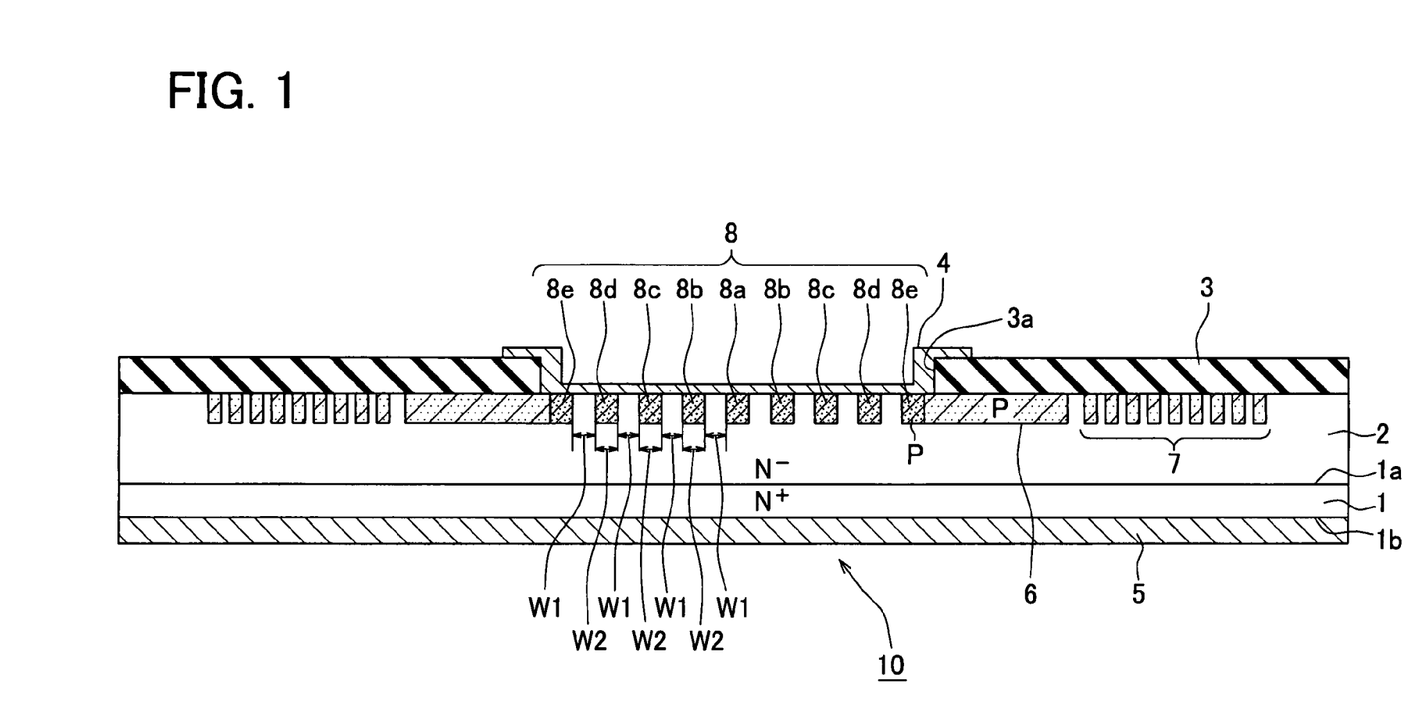
FIG. 1 is a cross sectional view of an SiC semiconductor device.
Figure 2:
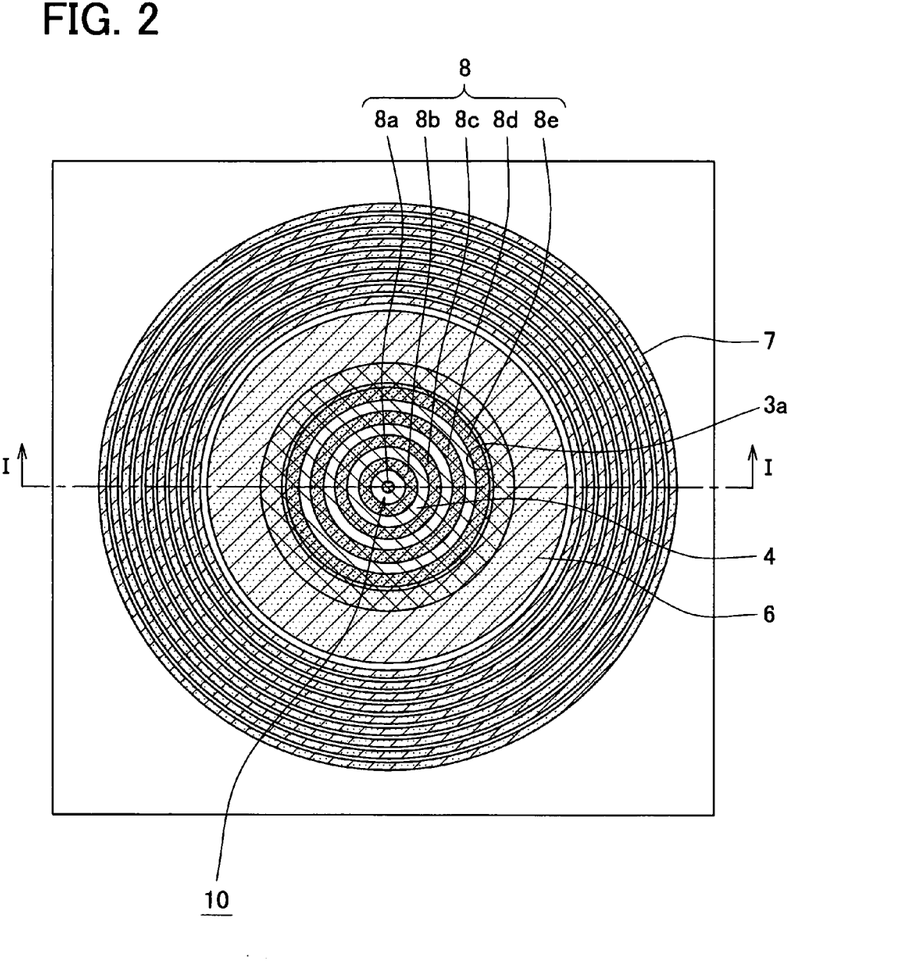
FIG. 2 is a layout diagram schematically illustrating elements arranged in a principal surface part of the SiC semiconductor device according to a first embodiment.

The SiC semiconductor device having the SBD 10 shown in FIG. 1 is provided through the above-described processes.

As is described above, in the SiC semiconductor device according to the present embodiment, the multiple ring members 8b-8e are concentrically arranged on the contact region between the Schottky electrode 4 and the N– type drift layer 2. An arrangement of the P type layers 8 is symmetric with respect to the center member 8a. Moreover, on the cross section of the SiC semiconductor device taken along a plane passing through the center member 8a and perpendicular to the principal surface 1a of the substrate 1, an arrangement of cross sections of the ring members 8b-8d is symmetric between the center member 8a and the outermost ring member 8e. It is thus possible to provide a high symmetric structure. Further, it is possible to provide a simple design of the overlap part, at which the P type layers 8 may overlap with the termination structure including the P type resurf layer 6 and the P type guard ring layers 7. It is possible to reduce a leakage current when the SBD is reverse-biased. It is possible provide the SiC semiconductor device having the SBD, the SiC semiconductor device having the high yield ratio and high breakdown voltage.

Second Embodiment

An SiC semiconductor device according to a second embodiment is described below with reference to FIG. 4. Note that FIG. 1 also corresponds to a cross sectional view of the SiC semiconductor device shown in FIG. 4 where the view is taken along a line I-I shown in FIG. 4. The SiC semiconductor device according to the present embodiment differs from the SiC semiconductor device according to the first embodiment in layouts of an SBD and a termination structure disposed in an area surrounding P type layers 8.

Figure 4:
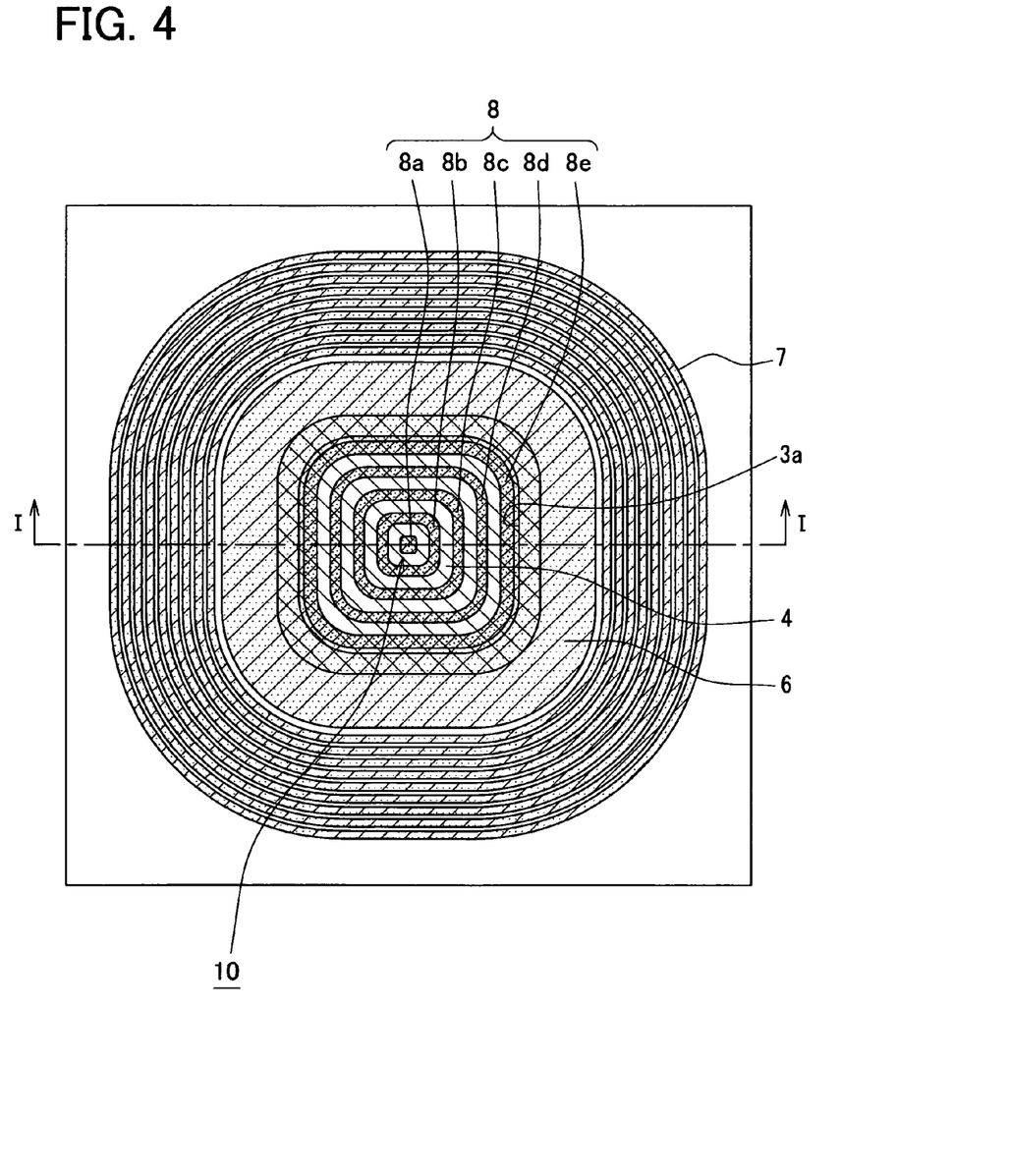
FIG. 4 is a layout diagram schematically illustrating elements arranged in a principal surface part of an SiC semiconductor device according to a second embodiment.

As shown in FIG. 4, a P type resurf layer 6 has an almost square ring shape with rounded corners. In accordance with the shape of the P type resurf layer 6, multiple P type ring members 8b-8e also have an almost square ring shape with rounded corners. A center member 8a surrounded by the ring members 8b-8e is an almost square shape with rounded corners.

In the above configuration, an arrangement of the P type layers 8 is symmetric on a contact region between the Schottky electrode 4 and an N– type drift layer 2. Moreover, on a cut plane of the SiC semiconductor device appearing when cutting the SiC semiconductor device in a radial direction along a line passing through the center member 8a, an arrangement of the ring members 8b-8d is symmetric between the center member 8a and the outermost ring member 8e. It is thus possible to provide a high symmetric structure. It is possible to provide a simple design of an overlap part, at which the P type layers 8 may overlap with the termination structure member including the P type resurf layer 6 and the P type guard ring layers 7. It is possible to reduce a leakage current when the SBD is reverse-biased. It is possible to provide the SiC semiconductor device having the SBD, the SiC semiconductor device having high yield ratio and a high breakdown voltage.

Third Embodiment

An SiC semiconductor device according to a third embodiment is described below with reference to FIG. 5. Note that FIG. 1 also substantially corresponds to a cross sectional view of the SiC semiconductor device shown in FIG. 5 where the view is taken along a line I-I shown in FIG. 5.

Figure 5:
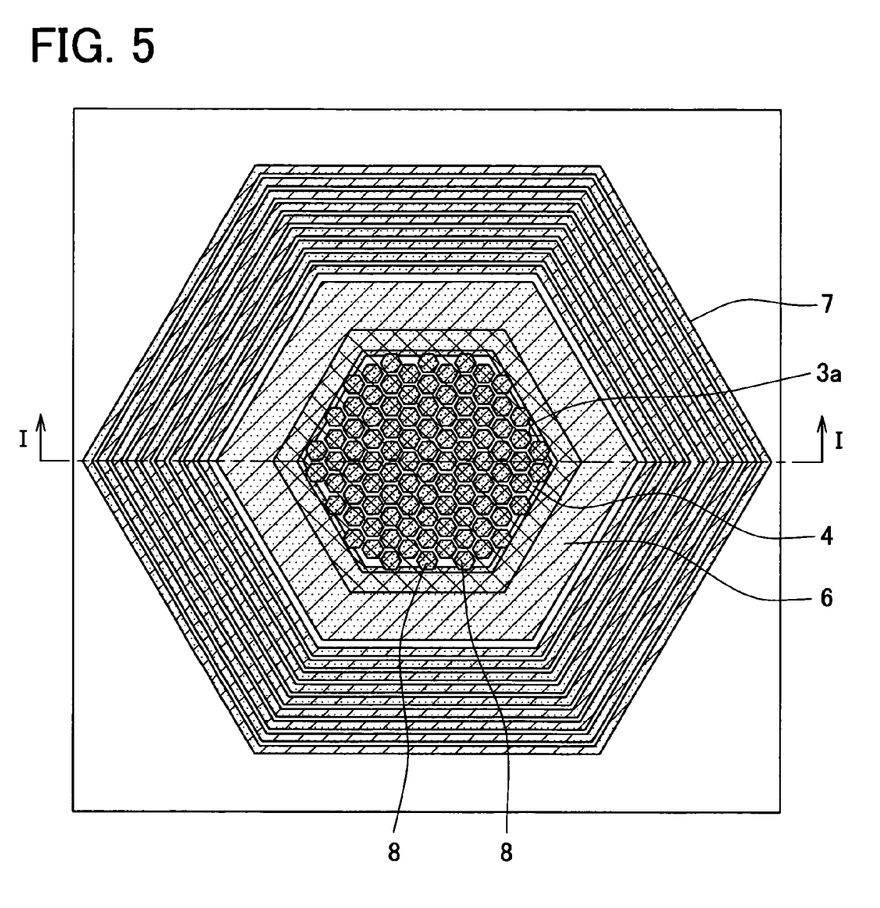
FIG. 5 is a layout diagram schematically illustrating elements arranged in a principal surface part of the SiC semiconductor device according to a third embodiment.

As shown in FIG. 5, a P type resurf layer 6 is an almost regular hexagonal ring shape and surrounds multiple P type layers 8. Each P type layer 8 has an almost hexagonal shape and the multiple P type layers 8 are arranged so as to have a honeycomb structure. Each P type layer 8 has almost the same size. An N– type drift layer 2 is arranged in such a manner that a part of the N– type drift layer 2 surrounds the P type layers 8; in other words, the part of the N– type drift layer 2 is disposed at spaces between adjacent P type layers 8. The spaces between adjacent P type layers 8 have substantially a same width. Arrangement of the multiple P type layers 8 is point-symmetric with respect to the center of the Schottky electrode 4. In FIG. 5, the number of the P type layers 8 appearing on a cross sectional view is six, the cross sectional view being taken along a line I-I in FIG. 5. Alternatively, the number of the P type layers 8 on the cross sectional view may be more or less than six. Note that it does not matter that FIG. 5 is different from FIG. 1 in the number of the P type layers 8 appearing on the cross sectional view.

In the above configuration, the arrangement of the P type layers 8 is symmetric with respect to the center of a contact region between a Schottky electrode 4 and the N– type drift layer 2. Moreover, on a cross sectional view of the SiC semiconductor device taken along a plane passing through the center of the contact region and perpendicular to the principal surface of the substrate, an arrangement of cross sections of the ring members 8b-8d is symmetric. It is thus possible to provide a high symmetric structure. The SiC semiconductor device according to the present embodiment has advantages similar to that according to the first embodiment. Namely, it is possible to provide a simple design of an overlap part, at which the P type layers 8 may overlap with the termination structure member including the P type resurf layer 6 and the P type guard ring layers 7. It is possible to reduce a leakage current when the SBD is reverse-biased. It is possible provide the SiC semiconductor device having the SBD, the SBD semiconductor device having high yield ratio and a high breakdown voltage.

Other Embodiments

In the above-described embodiments, the number of the P type layers 8 corresponds to that shown in FIGS. 1-5. Alternatively, a different number of the P type layers 8 may be provided.

In the second embodiment, inner and outer circumferences of the P layers 6, 8 have the almost square shape with rounded corners. Alternatively, the inner and outer circumferences of the layers 6, 8 may have an almost polygonal shape with rounded corners.

In the above-described embodiments, conductivity types of elements of the SiC semiconductor device are specified. When a first conductivity type and a second conductivity type are defined for a general description, the first and second conductivity types, respectively, correspond to N and P conductivity types in the above described embodiments. Alternatively, the first and second conductivity types may be provided by P and N conductivity types, respectively. For example, the layer 2 and the layers 8 may have the P and N conductivity types, respectively.

In the above-described embodiments, the processes shown in FIG. 3B and FIG. 3C are provided separately from each other. Alternatively, the processes corresponding to that shown in FIG. 3B and FIG. 3C may be combined in one process. More specifically, the P type resurf layer 6 and the P type guard ring layers 7 as well as the multiple P type layers 8 are capable of simultaneously being formed by forming additional openings on areas of the mask 11, the areas which correspond to locations where the P type layers 8 are to be formed. The above manner can simplify manufacturing process. However, when the processes corresponding to that shown FIG. 3B and FIG. 3C are performed separately from each other, impurity concentration of the multiple P type layers 8 are capable of being provided differently from that of the P type resurf layer 6 and the P type gurad ring layers 7. Moreover, the impurity concentration of the multiple P type layers 8 is capable being provided so that as the closer a surface of the N– type drift layer 2, the impurity concentration becomes higher. A forward P-N mode is therefore capable of being more reliably performed at P-N junctions between the multiple P type layers 8 and the N– type drift layer 2.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:
1. An SiC semiconductor device comprising:
    a substrate made of silicon carbide, having a first conductivity type, and having a principal surface and a rear surface opposite to each other;
    a drift layer made of silicon carbide, having the first conductivity type, and disposed on the principal surface of the substrate, wherein an impurity concentration of the drift layer is lower than an impurity concentration of the substrate;
    an insulating layer disposed on the drift layer and including an opening, wherein a part of the substrate and a part of the drift layer are defined as a cell, which is positioned between the opening of the insulating layer and the rear surface of the substrate;
    an ohmic electrode disposed on the rear surface of the substrate;
    a Schottky electrode contacting with the drift layer through the opening of the insulating layer;
    a Schottky barrier diode provided by the ohmic electrode, the Schottky electrode and the cell;

a termination structure that is disposed on an outer periphery of the cell, and that includes a resurf reduced surface field layer disposed in a surface part of the drift layer, wherein the resurf layer surrounds the cell; and a plurality of second conductivity type layers disposed in another surface part of the drift layer, contacting the Schottky electrode, surrounded by the resurf layer, and separated from one another, wherein:

the first conductivity type and the second conductivity type are opposite conductivity types;

the plurality of second conductivity type layers includes a center member, which is disposed at a center of a contact region between the Schottky electrode and the drift layer;

the plurality of second conductivity type layers further includes a plurality of ring members, each of which surrounds the center member;

each of the plurality of ring members is arranged substantially in a point symmetric manner on the contact region with respect to a center of the center member;

one of the plurality of ring members is defined as an outermost ring member, which is disposed most distant from the center member;

the plurality of ring members except the outermost ring member is defined as a plurality of inner ring members;

a two-dimensional plane passing through the center of the contact region and perpendicular to the principal surface of the substrate is defined as a reference plane;

a plurality of cross sections corresponding to the plurality of inner ring members taken along the reference plane is defined as a plurality of inner ring cross sections;

the plurality of second conductivity type layers is configured so that an arrangement of the plurality of inner ring cross sections on the reference plane is symmetric between a cross section of the center member and a cross section of the outermost ring member on the reference plane;

the plurality of ring members is arranged substantially in a concentric manner on the drift layer with respect to the center of the center member;

the plurality of second conductivity type layers is substantially arranged at regular intervals;

the regular interval is in a range between 1.5 μm and 2.5 μm;

each ring member has a same width along a radial direction of the center member;

the same width is in a range between 1.0 μm and 2.0 μm;

the outermost ring member is in contact with an inner circumference of the resurf layer or embedded in the resurf layer; and the plurality of second conductivity type layers, which includes the outermost ring member, is different in impurity concentration from the resurf layer.

2. The SiC semiconductor device according to claim 1, wherein:

the plurality of second conductivity type layers is configured so that the arrangement of the plurality of first cross sections on the reference plane is substantially symmetric with respect to an axis of symmetry, the axis passing through the center of the center member and being perpendicular to the principal surface of the substrate.

3. The SiC semiconductor device according to claim 1, wherein the center member has a substantially polygonal shape having a plurality of rounded corners, an inner circumference and an outer circumference of each ring member have a substantially polygonal shape having a plurality of rounded corners, and the polygonal shape of the center member is substantially similar to the inner and outer circumferences of each ring member.

4. The SiC semiconductor device according to claim 1, wherein the Schottky electrode is made of molybdenum, titanium, or nickel.

5. The SiC semiconductor device according to claim 1, wherein each of the plurality of second conductivity type layers includes second conductivity type impurities, the impurity concentration of which is in a range between $5\times10^{17}$ $cm^{-3}$ and $1\times10^{20}$ $cm^{-3}$.

6. The SiC semiconductor device according to claim 1, wherein the impurity concentration of each second conductivity type layer spatially varies in the second conductivity type layer such that the impurity concentration in a part of the second conductivity type layer becomes higher as the part of the second conductivity type layer is closer to the contact region between the Schottky electrode and the second conductivity type layer.

7. The SiC semiconductor device according to claim 1, wherein:

the impurity concentration of second conductivity type impurities in each of the plurality of second conductivity type layers is in a range between $5\times10^{17}$ $cm^{-3}$ and $1\times10^{20}$ $cm^{-3}$; and the impurity concentration of second conductivity type impurities in the resurf layer is in a range between $5\times10^{16}$ $cm^{-3}$ and $1\times10^{18}$ $cm^{-3}$.

* * * * *